United States Patent
Ma et al.

(10) Patent No.: US 7,129,459 B2
(45) Date of Patent: Oct. 31, 2006

(54) WIRE-BONDABLE IMAGE SENSOR HAVING INTEGRAL CONTAMINANT SHADOWING REDUCTION STRUCTURE

(75) Inventors: Guolin Ma, Milpitas, CA (US); Bahram Afshari, Los Altos, CA (US); Jason Hartlove, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 25 days.

(21) Appl. No.: 11/022,116

(22) Filed: Dec. 23, 2004

(65) Prior Publication Data

US 2006/0138304 A1    Jun. 29, 2006

(51) Int. Cl.
*H01L 27/00* (2006.01)
*H01L 31/0232* (2006.01)

(52) U.S. Cl. ................................. 250/208.1; 257/432
(58) Field of Classification Search ............ 250/208.1, 250/216, 226; 257/432, 433, 435
See application file for complete search history.

(56) References Cited

U.S. PATENT DOCUMENTS

| | | | |
|---|---|---|---|
| 4,894,707 A * | 1/1990 | Yamawaki et al. | 257/680 |
| 5,280,373 A | 1/1994 | Ozawa et al. | |
| 5,283,691 A * | 2/1994 | Ogasawara | 359/566 |
| 5,479,049 A | 12/1995 | Aoki et al. | |
| 5,615,032 A | 3/1997 | Kalmanash et al. | |
| 6,040,235 A | 3/2000 | Badehi | |
| 6,369,417 B1 | 4/2002 | Lee | |
| 6,464,692 B1 | 10/2002 | Ruiz et al. | |
| 6,534,340 B1 * | 3/2003 | Karpman et al. | 438/113 |
| 6,646,289 B1 | 11/2003 | Badehi | |

FOREIGN PATENT DOCUMENTS

WO    WO 01/43181    6/2001

OTHER PUBLICATIONS

"Shellop," Shellcase, http://www.shellcase.com/pages/products.asp (Downloaded Dec. 14, 2004).

* cited by examiner

*Primary Examiner*—Kevin Pyo (57) ABSTRACT

A wire-bondable image sensor having an integral contaminant shadowing reduction structure is described. In one aspect, an image sensor includes a substrate that has a side supporting at least one imaging area and at least one wirebonding area. Light detectors are constructed and arranged to receive light through the imaging area. Bond pads are exposed in the wirebonding area for connecting to respective bond wires. A contaminant shadowing reduction structure on the imaging area has an exposed contaminant displacement surface over the imaging area and separated from the imaging area by a distance of at least 300 μm. The contaminant shadowing reduction structure is substantially transparent to radiation within an operative wavelength range specified for the image sensor. Methods of making the above-mentioned image sensor also are described.

15 Claims, 8 Drawing Sheets

WIRE-BONDABLE IMAGE SENSOR HAVING INTEGRAL CONTAMINANT SHADOWING REDUCTION STRUCTURE

BACKGROUND

Image sensors typically include a one-dimensional linear array or a two-dimensional array of light sensitive regions (often referred to as "pixels") that generate electrical signals that are proportional to the intensity of the light respectively received in the light sensitive regions. Solid-state image sensors are used in a wide variety of different applications, including digital still cameras, digital video cameras, machine vision systems, robotics, guidance and navigation applications, and automotive applications.

One class of image sensors is based on charge-coupled device (CCD) technology. In a common implementation, a CCD image sensor includes an array of closely spaced metal-oxide-semiconductor (MOS) diodes. In operation, a sequence of clock pulses is applied to the MOS diodes to transfer charge across the imaging area. Another class of image sensors is based on active pixels sensor (APS) technology. Each pixel of an APS image sensor includes a light sensitive region and sensing circuitry. The sensing circuitry includes an active transistor that amplifies and buffers the electrical signals generated by the associated light sensitive region. In a common implementation, APS image sensors are made using standard complementary metal-oxide-semiconductor (CMOS) processes, allowing such image sensors to be readily integrated with standard analog and digital integrated circuits.

An individual image sensor chip oftentimes is mounted inside a camera module package, which protects the image sensor against damage from environmental hazards that may arise after the image sensor chip has been packaged. The image sensor chip commonly is electrically connected to the leads of the camera module package through bond wires that are attached to bond pads on the topside of the image sensor chip or through solder bumps on the backside of the image sensor chip. Although solder-bump bonded electrical connections provide improved data rate performance due to their shorter length, wirebonded electrical connections are favored in terms of cost and throughput.

In addition to post-packaging-generated contamination, the performance and the yield of image sensors also are compromised by the presence of contaminants, such a dust and other particles, that are generated during fabrication, dicing, and packaging of the image sensors. The presence of these contaminants tend to damage various components of the image sensors, including the pixels in the image (or pixel) areas, the bond pads, and the electrical traces on the surfaces of the image sensors that carry signals to and from bonding pads.

Various approaches have been proposed for protecting wire-bondable image sensors against damage and defects that are caused by contaminants that are generated prior to the dicing and packaging of individual image sensor chips. In one approach, a photo-etchable cover wafer is attached to a semiconductor wafer containing a plurality of image sensor dice prior to dicing and packaging of individual image sensor chips. The cover wafer protects the image sensor substrate from environmental hazards, such as particulate contaminants, moisture, processing agents such as solvents, and inadvertent scratching of the image sensor substrate. In another approach, a thin, transparent, water-repellant and oil-repellant resin is applied over the image sensors prior to dicing and packaging. The low surface energy of the resin layer is purported to substantially prevent dust from attaching to the resin layer and to readily allow any dust that manages to attach to the resin layer to be removed easily by means of a cotton swab or the like.

The proposed image sensor protection approaches described above appear to reduce the damage caused by contaminants during fabrication and packaging of the image sensors. These approaches, however, do not address the additional need to reduce the adverse impact caused by the presence of contaminants that interfere with the reception of light by the pixels in the imaging area and thereby cause defects in the images captured by the image sensors.

SUMMARY

In one aspect, the invention features an image sensor that includes a substrate having a side supporting at least one imaging area and at least one wirebonding area. Light detectors are constructed and arranged to receive light through the imaging area. Bond pads are exposed in the wirebonding area for connecting to respective bond wires. A contaminant shadowing reduction structure on the imaging area has an exposed contaminant displacement surface over the imaging area and separated from the imaging area by a distance of at least 300 μm. The contaminant shadowing reduction structure is substantially transparent to radiation within an operative wavelength range specified for the image sensor.

In another aspect, the invention features a method fabricating an image sensor. In accordance with this inventive method, image sensor dice are formed on a wafer. Each of the dice comprises light detectors constructed and arranged to receive light through a respective imaging area and bond pads in a wirebonding area. A contaminant shadowing reduction structure is formed on the dice. The contaminant shadowing reduction structure has an exposed contaminant displacement surface over the imaging areas and separated from the imaging areas by a distance of at least 300 μm. The contaminant shadowing reduction structure is substantially transparent to radiation within an operative wavelength range specified for the image sensor. Regions of the contaminant shadowing reduction structure over the wirebonding areas of the dice are removed to expose the bond pads. The dice are separated into respective image sensor chips.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The embodiments that are described in detail below include a contaminant shadowing reduction structure that reduces the adverse effects of contaminants that interfere with the reception of light by the pixels in the imaging area and thereby cause defects in the images captured by the image sensors. The contaminant shadowing reduction structure includes a contaminant displacement surface that prevents contaminants, whether generated during the process of manufacturing the image sensors or generated during operation of devices incorporating the images sensors, from producing a significant shadowing on the underlying imaging area. In this way, the contaminant shadowing reduction structure improves image capturing performance and the manufacturing yields associated with these embodiments.

Figure 1A:
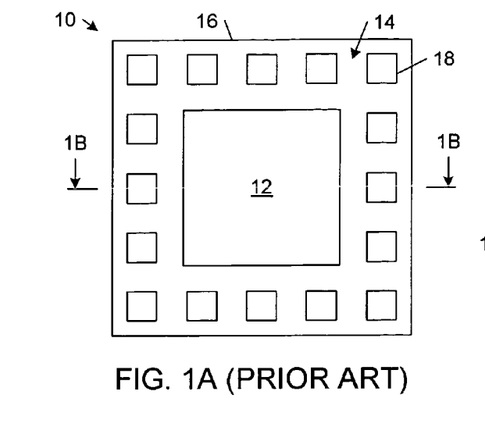
FIG. 1A is a diagrammatic top view of an embodiment of an image sensor chip.
Figure 1B:
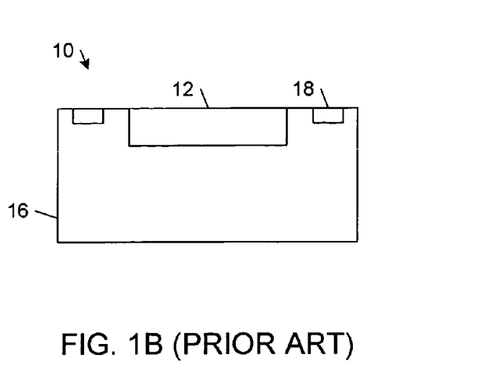
FIG. 1B is a diagrammatic sectional view of the image sensor chip embodiment shown in FIG. 1A taken along the line 1B—1B.

FIGS. 1A and 1B diagrammatically show an embodiment of a prior art image sensor chip 10 that includes an imaging area 12 and a surrounding wirebonding area 14 that are supported on one side of a substrate 16. The imaging area 12 includes a plurality of light detectors and associated readout circuitry for detecting incoming light received through the imaging area 12. Each light detector typically corresponds to a pixel of the imaging area 12. The imaging area 12 also may include a color filter array above the light detectors, as well as other known optical components and circuit elements. The wirebonding area 14 includes a plurality of bond pads 18 that are exposed for connecting to respective terminals of an optoelectronic device module or package through respective bond wires. In a typical implementation, the substrate 16 is a semiconductor substrate (e.g., silicon). The structures that are formed in substrate 16 may be fabricated in accordance with any semiconductor device fabrication process, including CMOS, bipolar CMOS (BiCMOS), and bipolar junction transistor fabrication processes.

Figure 2:
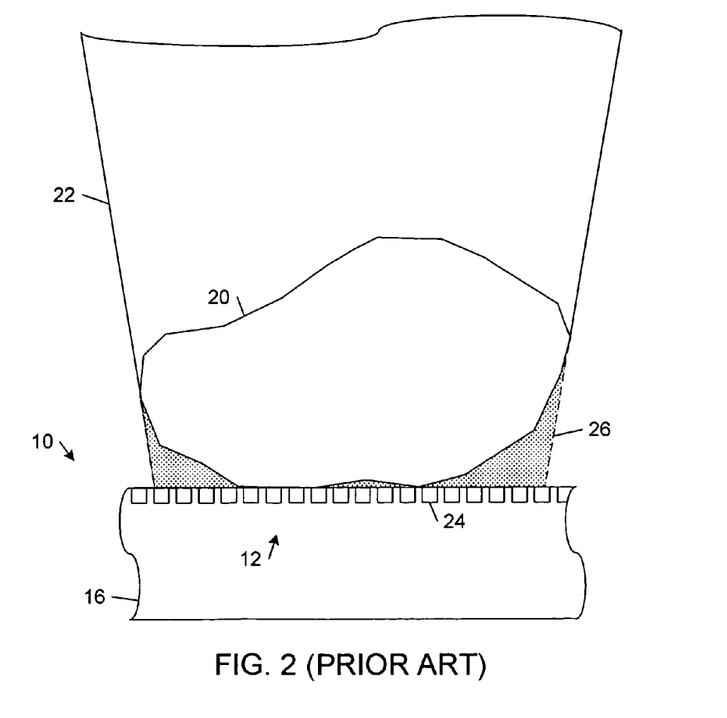
FIG. 2 is a diagrammatic sectional view of a particulate contaminant on a portion of the imaging area of the image sensor chip embodiment shown in FIG. 1B.

FIG. 2 shows a particulate contaminant 20 on a portion of the imaging area 12 of the image sensor chip 10 shown in FIG. 1B. The particulate contaminant 20 blocks incoming light 22 that is directed toward the photosites (or pixels) 24 in the portion of the imaging area 12 that is located directly underneath the particulate contaminant 20. That is, the particulate contaminant 20 casts a shadow 26 on the underlying photosites 24 and the pixel data generated by these photosites will correspond to dark pixels. Common image processing techniques are available for interpolating values for isolated dark pixels from neighboring pixels. Such pixel correction techniques, however, typically break down when more than a few pixels in a neighborhood are defective, in which case the images captured by the image sensor 10 will include noticeable defects in pixel regions corresponding to the pixels that are shadowed by the particulate contaminant 20.

In general, the particulate contaminant 20 may be generated during the process of manufacturing the image sensor 10 or during operation of a device incorporating the images sensor 10 (e.g., during movement of a lens in a camera incorporating the image sensor 10). Image sensor 10 typically is manufactured in a clean room environment that is characterized by particulate contaminants with diameters of about 30 μm (micrometers) or less. The particulate contaminants that are generated during use of the image sensor 10, on the other hand, typically are about 100 μm in diameter and, in some cases, may by about 300 μm or greater in diameter. Since pixel sizes commonly are on the order of about 3 μm by 3 μm or less, the types of particulate contaminants that typically might become deposited on the imaging area 12 may cast shadows on regions of imaging area 12 that range from about 10 pixels by 10 pixels up to about 100 pixels by 100 pixels. To the extent that such contaminants cannot be reduced, the image capturing performance and manufacturing yields associated with the image sensors will be reduced. Consequently, it is highly desirable to reduce the shadowing impact of such contaminants.

Figure 3:
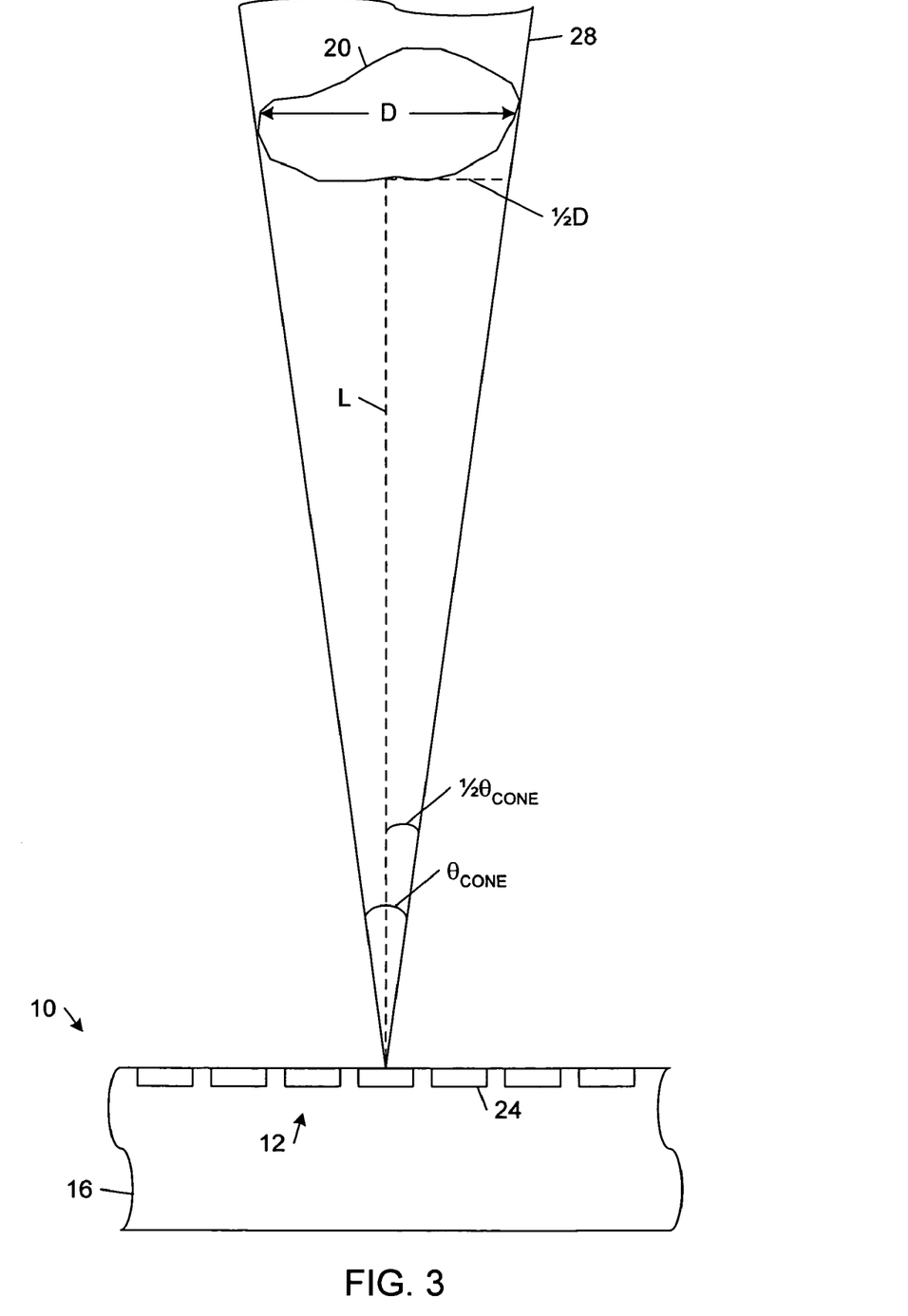
FIG. 3 is a diagrammatic sectional view of a particulate contaminant displaced from a portion of the imaging area of the image sensor chip embodiment shown in FIG. 1B by a distance L.

FIG. 3 shows that the shadowing impact of the particulate contaminant 20 on the underlying photosites 26 of imaging area 12 is reduced by increasing the separation distance L between the particulate contaminant 20 and the photosites 24. In the geometric optics ray tracing example shown in FIG. 3, the separation distance L at which the particulate contaminant 20 casts only a point shadow on the photosites 24 is given by:

$$L = \frac{D}{2\tan\left(\frac{1}{2}\theta_{CONE}\right)} \quad (1)$$

where D is the diameter of the particulate contaminant 20 and $\theta_{CONE}$ is the cone angle, which is given by:

$$\theta_{CONE} = 2 \times \sin^{-1}(NA) \quad (2)$$

where NA is the numerical aperture of a lens that focuses the light 28 onto the photosites 24. Since $NA \cong (2 \times f/\#)^{-1}$ for a typical NA<0.25, where f/# is the f-number of the lens, the separation distance L may be expressed in terms of the f-number as follows:

$$L = \frac{D}{2\tan(\sin^{-1}((2 \times f/\#)^{-1}))} \quad (3)$$

Assuming a typical particulate diameter D=100 μm and a typical f-number of 2.8 for common digital camera applications, the separation distance L is 275 μm, which on the order of about 300 μm to one significant digit. A larger separation would further reduce the shadowing impact of the particulate contaminant 20.

To summarize, the simple geometric optic ray tracing model presented in FIG. 3 shows that a separation distance of at least 300 μm between the particulate contaminant 20 and the photosites 24 in the imaging area 12 significantly reduces the shadowing effect of the particulate contaminant 20 on the underlying photosites 24.

Figure 4:
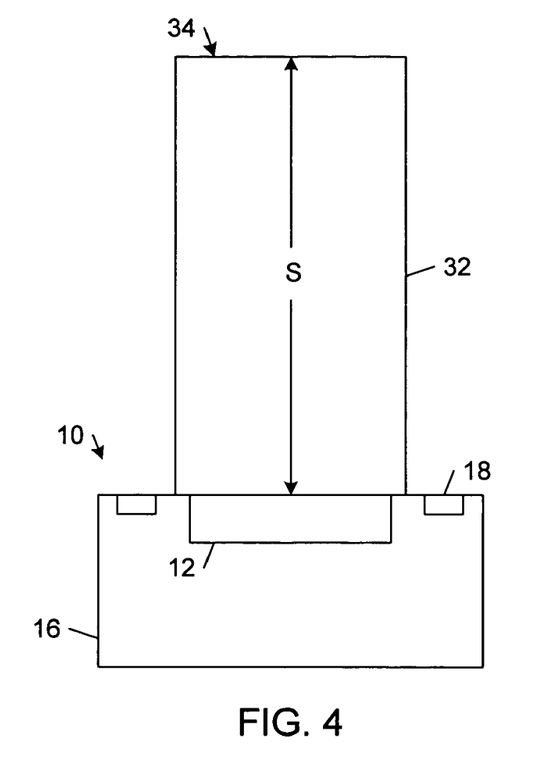
FIG. 4 is a diagrammatic sectional view of a contaminant shadowing reduction structure over the imaging area of embodiment of an image sensor chip.
Figure 5:
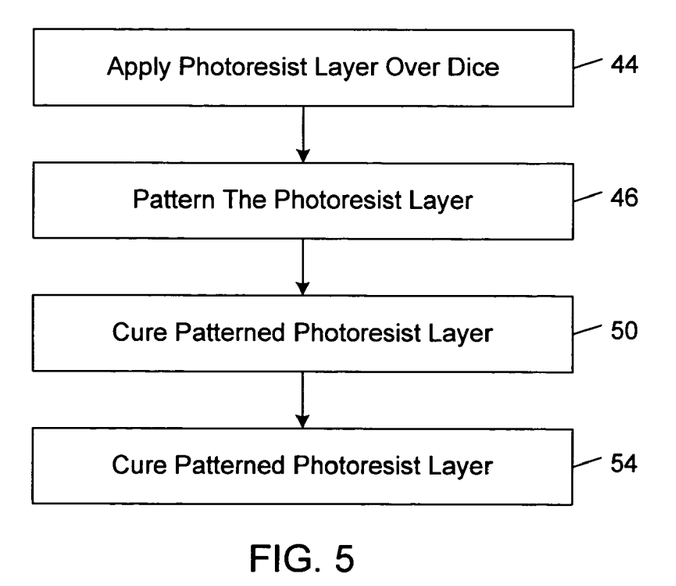
FIG. 5 is a flow diagram of an embodiment of a method of making an image sensor.

FIG. 4 shows an image sensor 30 that embodies the insights revealed by the model shown in FIG. 3 to improve the image capturing performance and the manufacturing yields that are associated with the image sensor 30. In particular, image sensor 30 includes over the imaging area 12 a contaminant shadowing reduction structure 32 that is substantially transparent to radiation within an operative wavelength range (e.g., 390 nm to 770 nm) specified for the image sensor 30. The contaminant shadowing reduction structure 32 has a contaminant displacement surface 34 that is separated from the imaging area 12 by a distance S of at least 300 μm. Therefore, contaminants that are generated during the dicing and packaging fabrication stages or during operation of the image sensor 30, and that adhere in the incoming light path of the image sensor 30, necessarily will be separated from the imaging area 12 by a distance of at least 300 μm. As a result, the adverse shadowing effect of particulate contaminants with expected sizes up to 100 μm in diameter will be reduced substantially.

It is noted that the shadowing impact of particulate contaminants with sizes larger than 100 μm also will be reduced substantially relative to approaches in which potential particulate contaminants are separated from the imaging areas by a smaller distance.

Exemplary implementations of the image sensor 30 are described below.

EXAMPLE 1

Referring to FIGS. 5 and 6A–6C, a first implementation of the image sensor 30 is fabricated as follows.

Figure 6A:
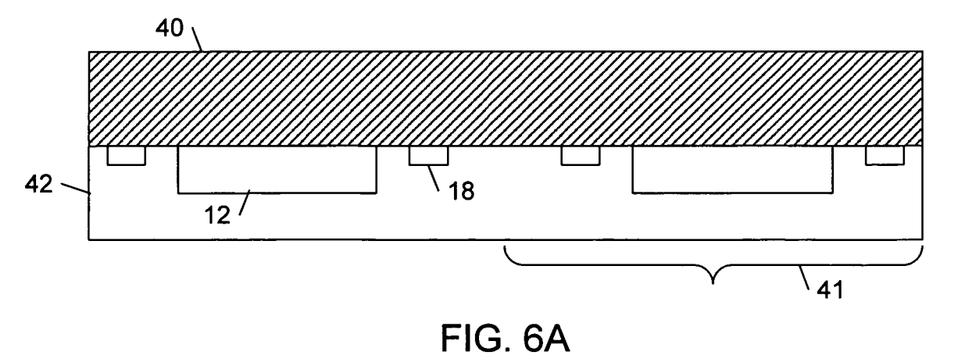
FIGS. 6A and 6B are diagrammatic sectional views of a portion of an embodiment of a wafer during different stages of the method of FIG. 5.

A photoresist layer 40 is applied over a plurality of image sensor dice 41 on a wafer 42 (block 44; FIG. 6A). The photoresist layer 40 is applied in one or more coats using a spin coating process. In this implementation, the applied photoresist layer 40 has a thickness of at least 300 μm. The photoresist layer 40 is substantially transparent to radiation within an operative wavelength range (e.g., the visible wavelength range) that is specified for the image sensors. An exemplary photoresist material is the NANO™ SU-8 2000 negative tone photoresist, which is available from Micro-Chem Corporation of Newton, Mass. U.S.A. In some implementations, at least one infrared light absorbing dye is incorporated in the photoresist. The infrared light absorbing dye preferably exhibits strong absorption in the wavelength range of 630 nm to 930 nm. Exemplary types of suitable infrared light absorbing dyes are anthraquinone dyes. After the photoresist layer 40 has been applied, the photoresist layer 40 may be soft-baked to evaporate the solvent and densify the film.

Figure 6B:
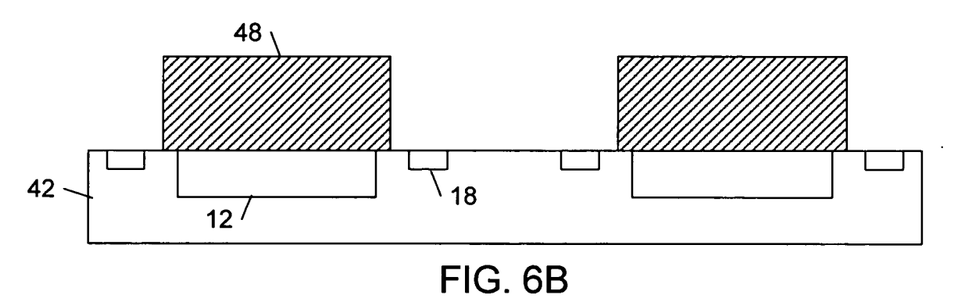

The photoresist layer 40 is patterned so that the remaining regions 48 of the photoresist layer 40 are disposed over the imaging areas 12 and the areas over the bond pads 18 are free of photoresist (block 46; FIG. 6B). The photoresist layer 40 is patterned using a photolithographic process, which may include exposing the photoresist layer 40, performing a post-exposure bake to selectively cross-link the exposed portions of the photoresist layer 40, and developing the unexposed portions of the photoresist layer 40.

Figure 6C:
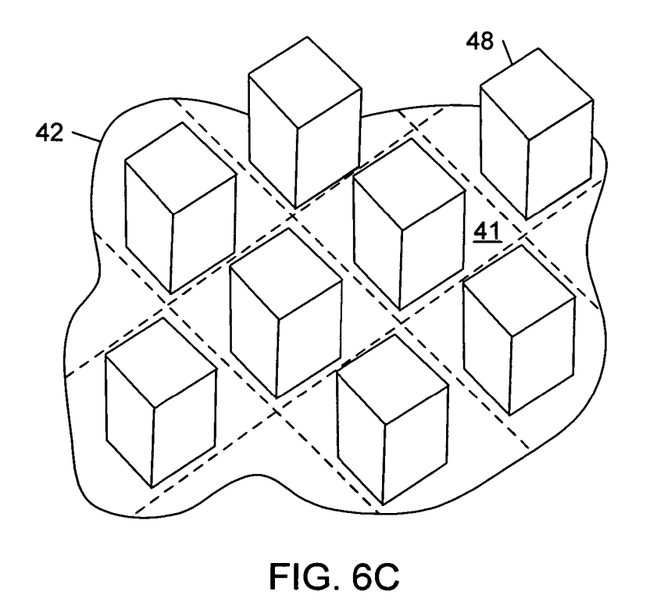
FIG. 6C is a diagrammatic perspective view of a portion of an embodiment, of a wafer containing a plurality of dice each of which includes an imaging area with an overlying contaminant shadowing reduction structure.
Figure 7:
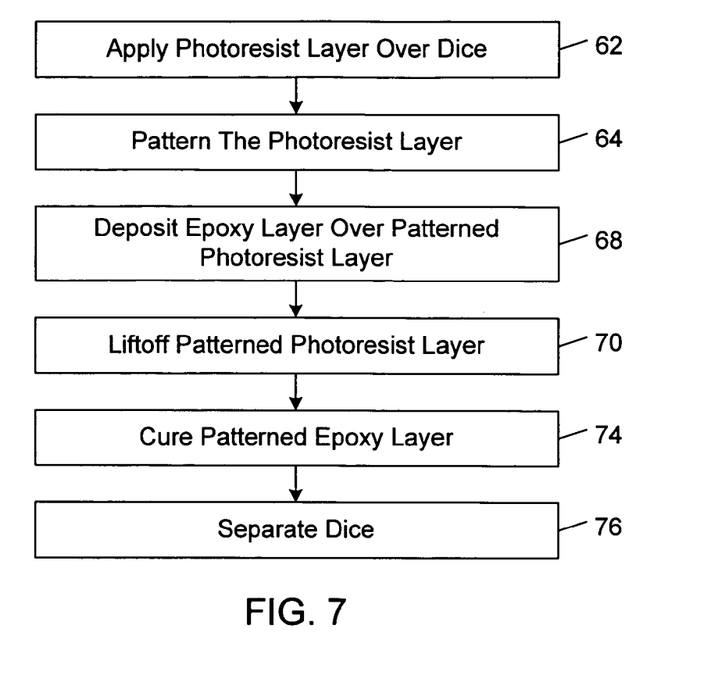
FIG. 7 is a flow diagram of an embodiment of a method of making an image sensor.

In some implementations, the remaining, cross-linked portions 48 of the photoresist layer 40 are optionally hard-baked to additionally cross-link (or cure) the remaining portions 48 of the photoresist layer 40 (block 50). FIG. 6C shows a perspective view of a portion of the wafer 42 containing a plurality of dice 41 each of which includes an imaging area with an overlying contaminant shadowing reduction structure consisting of a respective one of the cured portions 48 of the photoresist layer 40.

After the remaining cross-linked portions 48 of the photoresist layer 40 have been cured (block 50), the dice 41 are separated (block 54). The dice 41 may be separated using any known sawing or etching process that is suitable for cutting through the wafer 42.

EXAMPLE 2

Referring to FIGS. 7 and 8A–8D, a second implementation of the image sensor 30 is fabricated as follows.

Figure 8A:
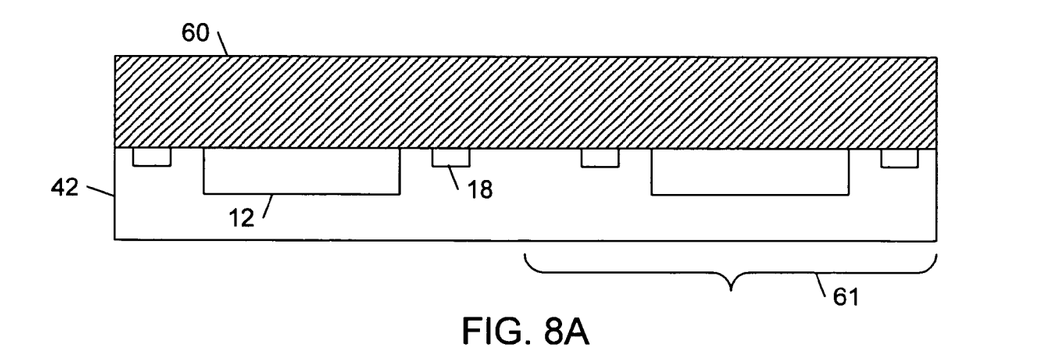
FIGS. 8A–8D are diagrammatic sectional views of a portion of an embodiment of a wafer during different stages of the method of FIG. 7.

A photoresist layer 60 is applied over a plurality of image sensor dice 61 on a wafer 42 (block 62; FIG. 8A). The photoresist layer 60 is applied in one or more coats using a spin coating process. In this implementation, the applied photoresist layer 60 has a thickness of at least 300 μm. An exemplary photoresist material is the NANO™ SU-8 2000 negative tone photoresist, which is available from Micro-Chem Corporation of Newton, Mass. U.S.A. After the photoresist layer 60 has been applied, the photoresist layer 60 may be soft-baked to evaporate the solvent and densify the film.

Figure 8B:
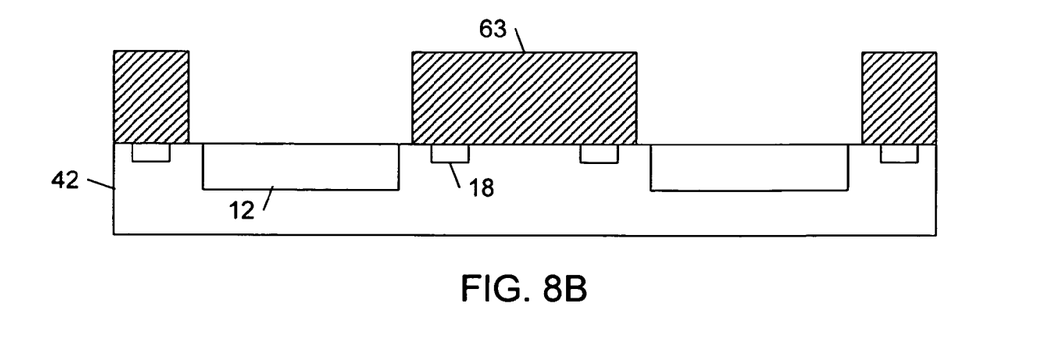

The photoresist layer 60 is patterned so that the remaining regions 63 of the photoresist layer 60 are disposed over the wirebonding areas 14 and the imaging areas 12 are free of photoresist (block 64; FIG. 8B). The photoresist layer 60 is patterned using a photolithographic process, which may include exposing the photoresist layer 60, performing a post-exposure bake to selectively cross-link the exposed portions of the photoresist layer 60, and developing the unexposed portions of the photoresist layer 60.

Figure 8C:
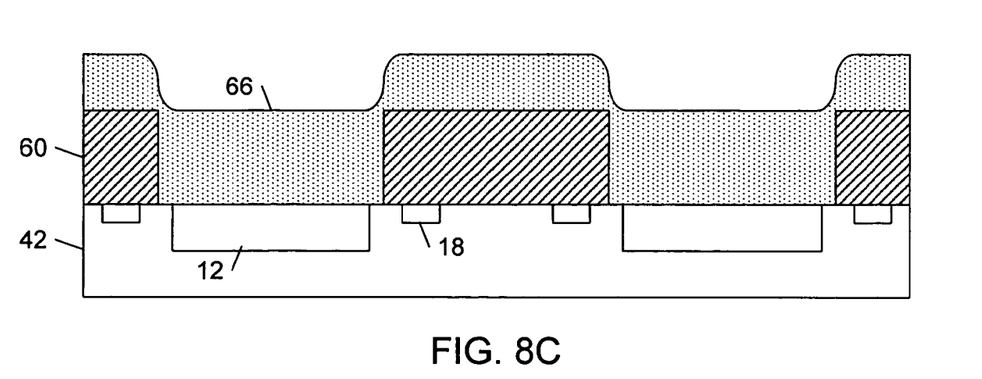

An epoxy layer 66 is applied over the patterned photoresist layer 60 (block 68; FIG. 8C). The epoxy layer 66 is applied in one or more coats using a spin-on coating process. In this implementation, the applied epoxy layer 66 has a thickness of at least 300 μm over the imaging areas 12. The epoxy layer 66 is substantially transparent to radiation within an operative wavelength range (e.g., the visible wavelength range) that is specified for the image sensors. In some implementations, at least one infrared light absorbing dye is incorporated in the epoxy layer 66. The infrared light absorbing dye preferably exhibits strong absorption in the wavelength range of 630 nm to 930 nm. Exemplary types of suitable infrared light absorbing dyes are anthraquinone dyes.

Figure 8D:
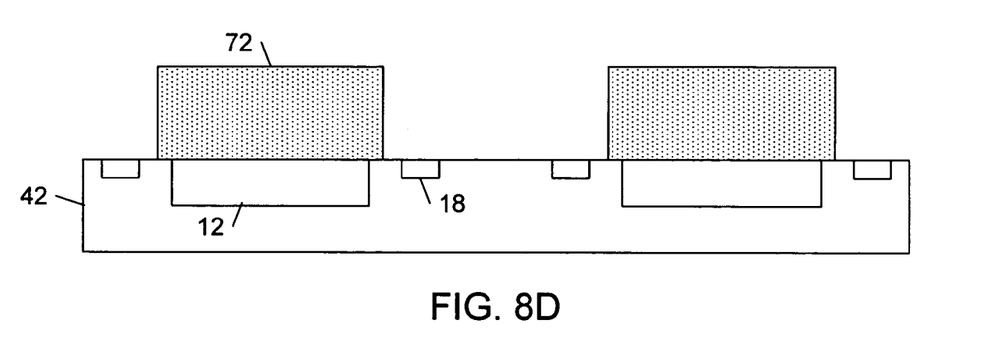
Figure 9:
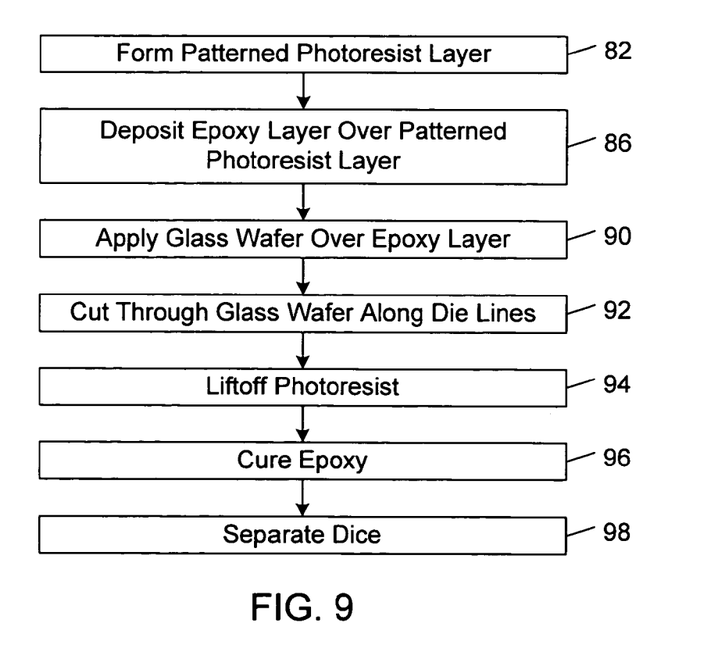
FIG. 9 is a flow diagram of an embodiment of a method of making an image sensor.

The patterned photoresist layer 60 is removed using a liftoff process (block 70; FIG. 8D). The liftoff process may be any type of liftoff process that is suitable for the photoresist layer 60, including an immersion, spray or spray-puddle liftoff process. A proprietary developer solution or other solvent-based developers may be used in the liftoff process. After the patterned photoresist layer 60 has been removed, the remaining regions 72 of the epoxy layer 66 are disposed over the imaging areas 12 and the areas over the bond pads 18 are free of photoresist and epoxy material, as shown in FIG. 8D.

In some implementations, the remaining portions 72 of the epoxy layer 66 are optionally hard baked to cure the remaining portions 72 of the epoxy layer 66 (block 74). The resulting cured portions 72 of the epoxy layer 66 appear much like the cured portions 48 of the photoresist layer 40 shown in FIG. 6C.

After the remaining portions 72 of the epoxy layer 66 have been cured (block 74), the image sensor dice 61 are separated (block 76). The dice 61 may be separated using any known sawing or etching process that is suitable for cutting through the wafer 42.

EXAMPLE 3

Referring to FIGS. 9 and 10A–10E, a third implementation of the image sensor 30 is fabricated as follows.

Figure 10A:
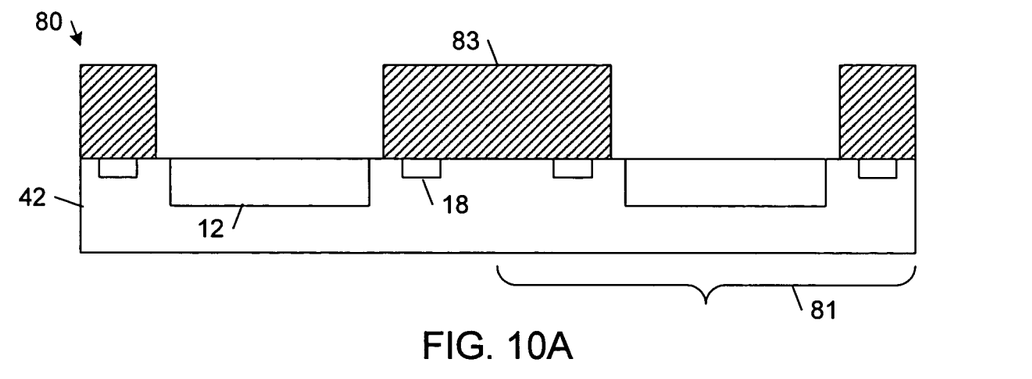
FIGS. 10A–10E are diagrammatic sectional views of a portion of an embodiment of a wafer during different stages of the method of FIG. 9.

A patterned photoresist layer 80 is applied over a plurality of image sensor dice 81 on a wafer 42 (block 82; FIG. 10A). The photoresist layer 80 is applied in one or more coats using a spin coating process. In this implementation, the applied photoresist layer 80 has a thickness ranging from 10 µm to at least 300 µm. An exemplary photoresist material is the NANO™ SU-8 2000 negative tone photoresist, which is available from MicroChem Corporation of Newton, Mass. U.S.A. After the photoresist layer 80 has been applied, the photoresist layer 80 may be soft-baked to evaporate the solvent and densify the film.

The photoresist layer 80 is patterned so that the remaining regions 83 of the photoresist layer 80 are disposed over the wirebonding areas 14 and the imaging areas 12 are free of photoresist. The photoresist layer 80 is patterned using a photolithographic process, which may include exposing the photoresist layer 80, performing a post-exposure bake to selectively cross-link the exposed portions of the photoresist layer 80, and developing the unexposed portions of the photoresist layer 80.

Figure 10B:
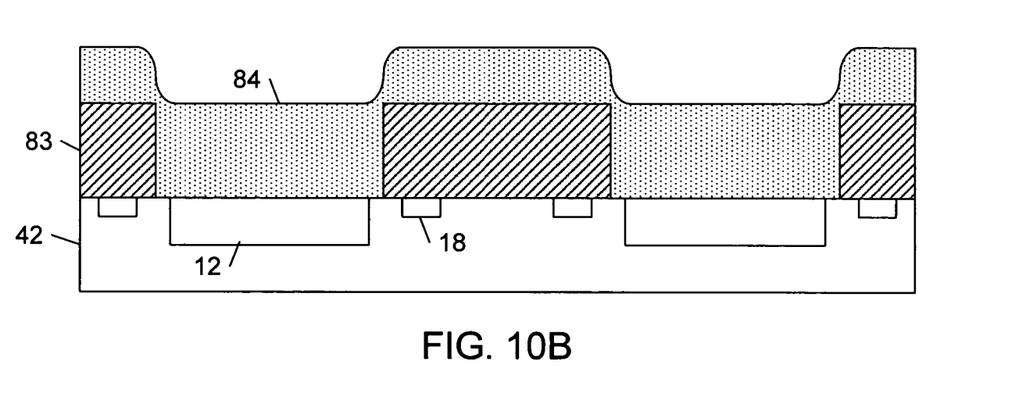

An epoxy layer 84 is deposited over the patterned portions 83 of the photoresist layer 80 (block 86; FIG. 10B). The epoxy layer 84 is applied in one or more coats using a spin-on coating process. In this implementation, the applied epoxy layer 84 has a thickness ranging from 10 µm to at least 300 µm. The epoxy layer 84 is substantially transparent to radiation within an operative wavelength range (e.g., the visible wavelength range) that is specified for the image sensors.

In some implementations, at least one infrared light absorbing dye is incorporated in the epoxy layer 84. The infrared light absorbing dye preferably exhibits strong absorption in the wavelength range of 630 nm to 930 nm. Exemplary types of suitable infrared light absorbing dyes are anthraquinone dyes. In these implementations, the epoxy layer 84 has a thickness of at least 200 µm so that a sufficient quantity of the infrared light absorbing dye is dispersed throughout the epoxy layer 84 to exhibit a specified level (e.g., greater than 80%) of infrared light passing through the epoxy layer 84 in the target absorption range is absorbed. The density and light absorption properties of the infrared light absorbing dye should not detrimentally affect the transmission of light in the operative wavelength range that is specified for the image sensors.

Figure 10C:
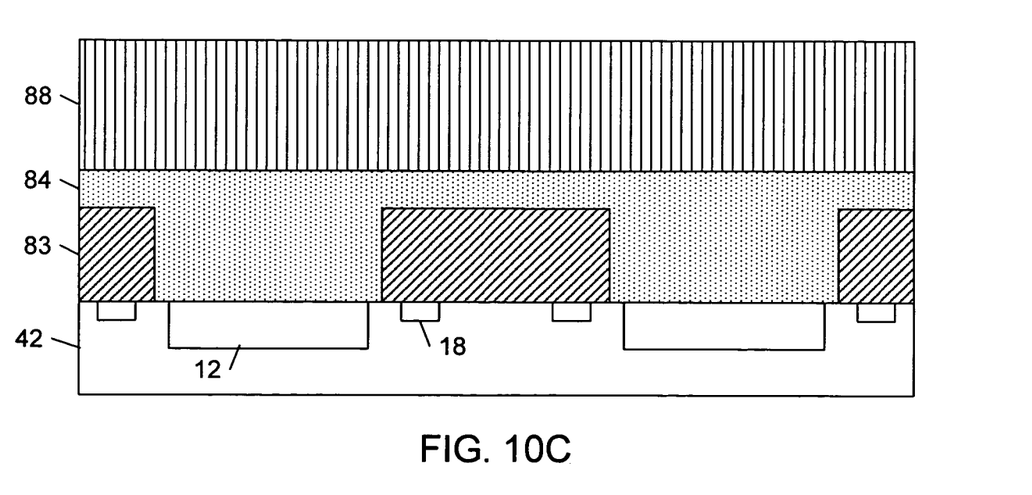

A glass wafer 88 is applied over the epoxy layer 84 (block 90; FIG. 10C). In one implementation, the glass wafer is at least 500 µm thick. A soft bake process may be performed to at least partially cure the epoxy material and thereby adhere the glass wafer 88 to the epoxy layer 84.

Figure 10D:
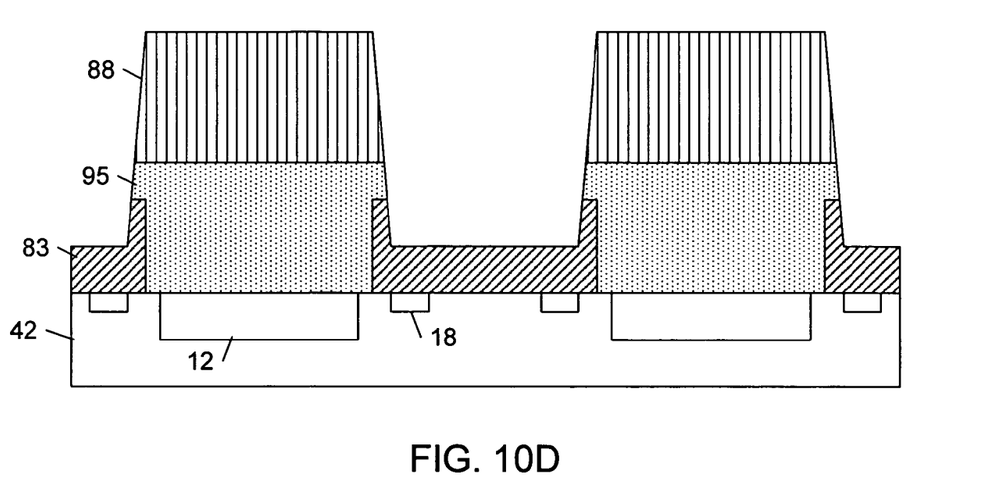

A dicing process is used to cut through the glass wafer along die lines between the individual image sensor dice 81 (block 92; FIG. 10D). Any known sawing or etching process that is suitable for cutting through the glass wafer 88 may be used in the dicing process. In this process, the patterned photoresist layer 80 protects the bond pads 18 and other metal traces in the wirebonding areas 14 against damage that otherwise might occur during the dicing process. During the dicing process, portions of the epoxy layer 84 and a top portion of the patterned photoresist layer 80 under the die lines may be removed as shown in FIG. 10D without detrimentally affecting the underlying bond pads 18 and other metal traces.

Figure 10E:
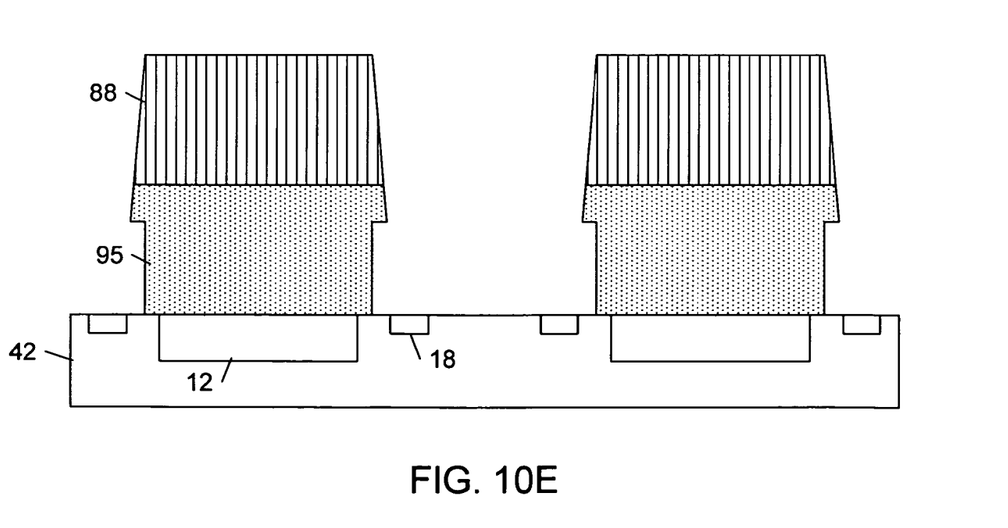

The remaining portions 83 of the patterned photoresist layer 80 are removed using a liftoff process (block 94; FIG. 10E). The liftoff process may be any type of liftoff process that is suitable for the photoresist layer 80, including an immersion, spray or spray-puddle liftoff process. A proprietary developer solution or other solvent-based developers may be used in the liftoff process. After the patterned portions 83 of the photoresist layer 80 have been removed, the remaining regions of the epoxy layer 84 and the glass wafer 88 are disposed over the imaging areas 12 and the areas over the bond pads 18 in the wirebonding areas 14 are free of photoresist and epoxy material, as shown in FIG. 10E.

In some implementations, the remaining portions 95 of the epoxy layer 84 are optionally hard baked to cure the remaining portions of the epoxy layer 84 (block 96). The resulting cured portions 95 of the epoxy layer 84 and the overlying portions of the glass wafer 88 appear similar to the cured portions 48 of the photoresist layer 40 shown in FIG. 6C.

After the remaining portions 95 of the epoxy layer 84 have been cured (block 96), the image sensor dice 81 are separated (block 98). The dice 81 may be separated using any known sawing or etching process that is suitable for cutting through the wafer 42.

Other embodiments are within the scope of the claims.

What is claimed is:

1. An image sensor, comprising:
   a substrate having a side supporting at least one imaging area and at least one wirebonding area;
   light detectors constructed and arranged to receive light through the imaging area;
   bond pads exposed in the wirebonding area for connecting to respective bond wires; and
   a contaminant shadowing reduction structure on the imaging area having an exposed contaminant displacement surface over the imaging area and separated from the imaging area by a distance of at least 300 µm, wherein the contaminant shadowing reduction structure comprises organic material that has a thickness of at least 200 µm and is substantially transparent to radiation within an operative wavelength range specified for the image sensor, the organic material having dispersed therein at least one infrared light absorbing dye and being patterned so that the bond pads are free of any overlying portions of the organic material.

2. The image sensor of claim 1, wherein the organic material comprises a cured epoxy resin.

3. The image sensor of claim 1, wherein the organic material comprises a cross-linked photoresist layer.

4. An image sensor, comprising:
   a substrate having a side supporting at least one imaging area and at least one wirebonding area;
   light detectors constructed and arranged to receive light through the imaging area;

bond pads exposed in the wirebonding area for connecting to respective bond wires; and a contaminant shadowing reduction structure on the imaging area having an exposed contaminant displacement surface over the imaging area and separated from the imaging area by a distance of at least 300 μm, wherein the contaminant shadowing reduction structure is substantially transparent to radiation within an operative wavelength range specified for the image sensor, wherein the contaminant shadowing reduction structure comprises a patterned, cross-linked photoresist layer having a thickness of at least 300 μm.

5. An imaging sensor, comprising:

a substrate having a side supporting at least one imaging area and at least one wirebonding area;

light detectors constructed and arranged to receive light through the imaging area;

bond pads exposed in the wirebonding area for connecting to respective bond wires; and a contaminant shadowing reduction structure on the imaging area having an exposed contaminant displacement surface over the imaging area and separated from the imaging area by a distance of at least 300 μm, wherein the contaminant shadowing reduction structure is substantially transparent to radiation within an operative wavelength range specified for the image sensor, wherein the contaminant shadowing reduction structure comprises a patterned, cured epoxy resin layer having a thickness of at least 300 μm.

6. The image sensor of claim 1, wherein the organic material comprises a cured epoxy resin layer and the contaminant shadowing reduction structure comprises a glass layer attached to the imaging area by the cured epoxy resin layer.

7. The image sensor of claim 6, wherein the epoxy resin layer comprises at least one infrared light absorbing dye dispersed therein and has a thickness of at least 200 μm.

8. The image sensor of claim 7, wherein the glass layer has a thickness of at least 500 μm.

9. A method fabricating an image sensor, comprising:

forming image sensor dice on a wafer, wherein each of the dice comprises light detectors constructed and arranged to receive light through a respective imaging area and bond pads in a wirebonding area;

forming on the dice a contaminant shadowing reduction structure having an exposed contaminant displacement surface over the imaging areas and separated from the imaging areas by a distance of at least 300 μm, wherein the forming of the contaminant shadowing reduction structure comprises depositing on the imaging areas organic material that has a thickness of at least 200 μm and is substantially transparent to radiation within an operative wavelength range specified for the image sensor and has dispersed therein at least one infrared light absorbing dye;

removing regions of the contaminant shadowing reduction structure over the wirebonding areas of the dice to expose the bond pads; and separating the dice into respective image sensor chips.

10. The method of claim 9, wherein the organic material comprises a cured epoxy resin having a thickness of at least 200 μm.

11. The method of claim 9, wherein the organic material comprises a cross-linked photoresist layer having a thickness of at least 200 μm.

12. A method fabricating an imaging sensor, comprising:

forming image sensor dice on a wafer, wherein each of the dice comprises light detectors constructed and arranged to receive light through a respective imaging area and bond pads in a wirebonding area;

forming on the dice a contaminant shadowing reduction structure having an exposed contaminant displacement surface over the imaging areas and separated from the imaging areas by a distance of at least 300 μm, wherein the contaminant shadowing reduction structure is substantially transparent to radiation within an operative wavelength range specified for the image sensor, wherein the forming of the contaminant shadowing reduction structure comprises forming a patterned, cross-linked photoresist layer having a thickness of at least 300 μm;

removing regions of the contaminant shadowing reduction structure over the wirebonding areas of the dice to expose the bond pads; and separating the dice into respective image sensor chips.

13. A method fabricating an image sensor, comprising:

forming image sensor dice on a wafer, wherein each of the dice comprises light detectors constructed and arranged to receive light through a respective imaging area and bond pads in a wirebonding area;

forming on the dice a contaminant shadowing reduction structure having an exposed contaminant displacement surface over the imaging areas and separated from the imaging areas by a distance of at least 300 μm, wherein the contaminant shadowing reduction structure is substantially transparent to radiation within an operative wavelength range specified for the image sensor, wherein the forming of the contaminant shadowing reduction structure comprises forming a patterned, cured epoxy resin layer having a thickness of at least 300 μm;

removing regions of the contaminant shadowing reduction structure over the wirebonding areas of the dice to expose the bond pads; and separating the dice into respective image sensor chips.

14. The method of claim 9, wherein the forming of the contaminant shadowing reduction structure comprises attaching to the dice a glass substrate having a thickness of at least 500 μm.

15. The method of claim 14, wherein the organic material comprises an uncured epoxy resin comprising at least one infrared light absorbing dye and the attaching comprises applying over the dice a layer of the uncured epoxy resin having a thickness of at least 200 μm, placing the glass substrate on the uncured epoxy resin layer, and curing the epoxy resin layer.

* * * * *